United States Patent
Shen et al.

(10) Patent No.: US 11,587,873 B2
(45) Date of Patent: Feb. 21, 2023

(54) BINARY METAL LINER LAYERS

(71) Applicant: Applied Materials, Inc., Santa Clara, CA (US)

(72) Inventors: Gang Shen, San Jose, CA (US); Feng Chen, San Jose, CA (US); Yizhak Sabba, Irvine, CA (US); Tae Hong Ha, San Jose, CA (US); Xianmin Tang, San Jose, CA (US); Zhiyuan Wu, San Jose, CA (US); Wenjing Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/909,148

(22) Filed: Jun. 23, 2020

(65) Prior Publication Data
US 2021/0351136 A1 Nov. 11, 2021

Related U.S. Application Data

(63) Continuation-in-part of application No. 16/867,990, filed on May 6, 2020, now Pat. No. 11,270,911.

(51) Int. Cl.
*H01L 23/532* (2006.01)
*H01L 21/768* (2006.01)
*H01L 23/522* (2006.01)

(52) U.S. Cl.
CPC .. *H01L 23/53238* (2013.01); *H01L 21/76846* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 4,914,059 A | 4/1990 | Nissim et al. | |
| 6,436,825 B1 | 8/2002 | Shue | |
| 8,841,769 B2 | 9/2014 | Park et al. | |
| 9,659,814 B2 | 5/2017 | Lakshmanan et al. | |
| 10,008,412 B2 | 6/2018 | Lakshmanan et al. | |
| 10,431,493 B2 | 10/2019 | Lakshmanan et al. | |
| 2006/0027932 A1 | 2/2006 | Yu et al. | |
| 2006/0063375 A1* | 3/2006 | Sun | H01L 21/76843 438/626 |

(Continued)

FOREIGN PATENT DOCUMENTS

CN 108063117 A 5/2018
WO 2013082370 A1 6/2013

OTHER PUBLICATIONS

Non-Final Office Action in U.S. Appl. No. 16/867,990, dated Aug. 5, 2021, 10 pages.

(Continued)

*Primary Examiner* — Xiaoming Liu
(74) *Attorney, Agent, or Firm* — Servilla Whitney LLC

(57) ABSTRACT

Described are microelectronic devices comprising a dielectric layer formed on a substrate, a feature comprising a gap defined in the dielectric layer, a barrier layer on the dielectric layer, a two metal liner film on the barrier layer and a gap fill metal on the two metal liner. Embodiments provide a method of forming a microelectronic device comprising the two metal liner film on the barrier layer.

16 Claims, 4 Drawing Sheets

(56) References Cited

U.S. PATENT DOCUMENTS

| | | |
|---|---|---|
| 2009/0209101 A1 | 8/2009 | Shinriki |
| 2011/0045171 A1* | 2/2011 | McFeely ............ H01L 21/02068 |
| | | 427/96.8 |
| 2011/0256469 A1* | 10/2011 | Tong ........................ H01M 4/92 |
| | | 977/773 |
| 2012/0115325 A1* | 5/2012 | Park ........................ B82Y 40/00 |
| | | 977/890 |
| 2013/0140698 A1* | 6/2013 | Lakshmanan ..... H01L 23/53238 |
| | | 438/653 |
| 2013/0221445 A1 | 8/2013 | Yu et al. |
| 2014/0024212 A1 | 1/2014 | Ryan et al. |
| 2017/0141159 A1 | 5/2017 | Kim |
| 2018/0250695 A1 | 9/2018 | Choi et al. |
| 2019/0148223 A1 | 5/2019 | Chou et al. |
| 2019/0185993 A1 | 6/2019 | Chen et al. |
| 2019/0378754 A1 | 12/2019 | Lakshmanan et al. |
| 2019/0385908 A1 | 12/2019 | Xie et al. |
| 2020/0027827 A1* | 1/2020 | Lin ........................ H01L 23/528 |
| 2020/0043858 A1 | 2/2020 | Wu et al. |
| 2021/0257293 A1* | 8/2021 | Lee ................... H01L 23/53295 |

OTHER PUBLICATIONS

PCT International Search Report and Written Opinion in PCT/US2021/030126 dated Aug. 25, 2021, 11 pages.
PCT International Search Report and Written Opinion in PCT/US2021/030783 dated Aug. 20, 2021, 9 pages.

* cited by examiner

BINARY METAL LINER LAYERS

CROSS-REFERENCE TO RELATED APPLICATIONS

This application claims priority to and is a continuation-in-part of U.S. application Ser. No. 16/867,990, filed on May 6, 2020, the entire disclosure of which is incorporated by reference.

TECHNICAL FIELD

Embodiments of the disclosure generally relate to binary metal liner layers methods of treating and/or doping binary metal liner layers. More particularly, embodiments of the disclosure are directed to binary metal liner layers comprising two metals.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures.

Specifically, for the 5 nm node and below, barrier and liner thickness for copper interconnects becomes even more challenging with respect to device reliability and adhesion of the barrier layer to a dielectric layer. Shrinking geometries also result in higher resistance as well as greater susceptibility to electro-migration (EM) failures in the copper lines. A high-quality bond at the interface between the copper and dielectric barrier layer can reduce or prevent EM failures. A typical thickness of a barrier layer and liner at the 5 nm node is on the order of about 45 Å. Thicker barrier/liner layers result in less space for metal gap fill and tend to increase resistivity. The current approach to improve metal/dielectric to metal adhesion and filling metal mobility during gap fill is to increase film thickness of a single material, and this approach is limited by single material intrinsic properties and thickness.

Therefore, there is a need for material layers and methods for depositing such material layers that improve metal/dielectric to metal adhesion.

SUMMARY

Embodiments of the disclosure provide a two metal liner film between a metal barrier layer and a gap fill metal. In one or more embodiments, the two metal liner film comprises two metals in a single film or in a first liner film and a second liner film.

In one or more embodiments, a method of forming a liner film comprises forming a barrier layer on the substrate; forming a two metal liner film the barrier layer; and forming a gap fill metal on the two metal liner film. Other method embodiments pertain to forming a microelectronic device, the method comprising forming a dielectric layer on a substrate, the dielectric layer comprising at least one feature defining a gap; forming a barrier layer on the dielectric layer; forming a two metal liner film on the barrier layer; and forming a gap fill metal on the two metal liner film.

Further embodiments of the disclosure are directed to a non-transitory computer readable medium including instructions, that, when executed by a controller of a processing system, causes the processing system to perform operations of forming a two metal liner film comprises forming a barrier layer on the substrate; forming a two metal liner film on the barrier layer; and forming gap fill metal on the two metal liner film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
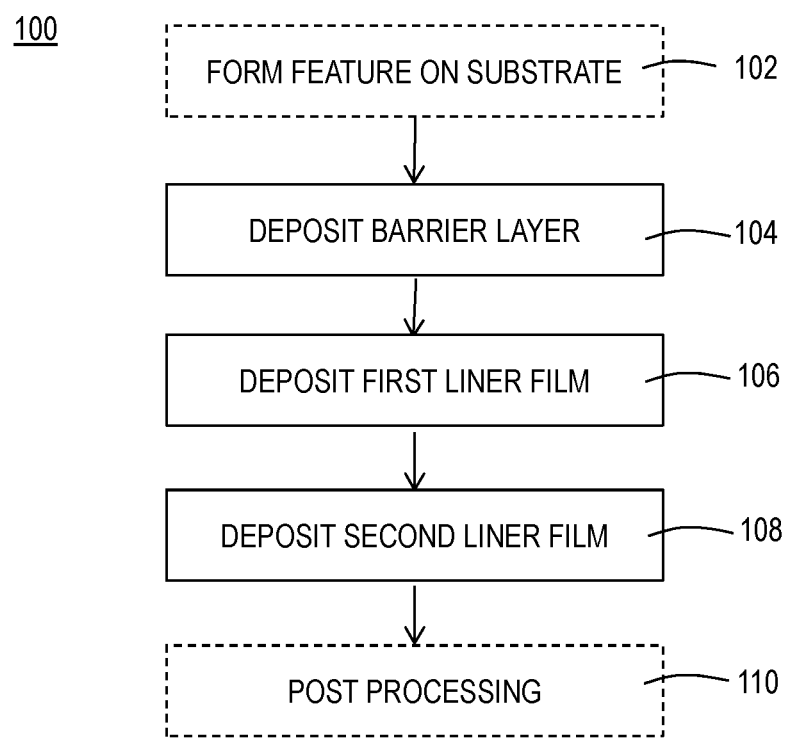
FIG. 1 illustrates a process flow diagram in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second time delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

It has advantageously been found that the adhesion of the barrier layer can be improved by depositing a liner film comprising two metals. In some embodiments, the two metal liner film comprises an alloy of the two metals in a single layer. In some embodiments, the two metal liner film comprises alternating layers of the two metals M1 and M2, or a first metal liner film and a second metal liner film In one or more embodiments, the two metals comprise two metals selected from the group consisting of (M1) cobalt (Co) and (M2) manganese (Mn); (M1) Co and (M2) tantalum (Ta); (M1) Co and (M2) tungsten (W); (M1) Co and (M2) molybdenum (Mo); (M1) ruthenium (Ru) and (M2) Mn; (M1) Ru and (M2) Ta; (M1) Ru and (M2) W; (M1) Ru and (M2) Mo; (M1) Ta and (M2) Mn; and (M1) Ta and (M2) W. In one or more embodiments, the two metal liner film has a thickness of less than 20 Angstroms.

According to one or more embodiments, the two metal liner film can be formed by various deposition methods, including alternating and/or co-flow precursors by ALD/CVD/PE-ALD, precursors with multi-metal ligands, dopant implanting, and or thermal diffusion. The two metal liner film can be formed in a single processing chamber or in multiple processing chambers. In one or more embodiments, the two metal liner film can be treated by various methods, including thermal treatment, plasma treatment and/or chemical treatment.

Advantageously, the two metal liner films according to one or more embodiments, which are ultra-thin (e.g., having a thickness of 20 Angstroms or less) provide better interfacial adhesion and mobility between two metals such as a barrier layer and a gap fill metal. The two metal liner films and methods described according to one or more embodiments, can be used in metal contact, interconnect, and capping applications. The two metal liner films according to one or more embodiments are thinner than current liners, which are typically greater than 20 Angstroms and up to 30 Angstroms. In some embodiments, liner films comprised of two metals have a thickness in a range of from 10 Angstroms to 20 Angstroms, from 10 Angstroms to 19 Angstroms, 10 Angstroms to 18 Angstroms, 10 Angstroms to 17 Angstroms, 10 Angstroms to 16 Angstroms, 10 Angstroms to 15 Angstroms, 10 Angstroms to 14 Angstroms, 10 Angstroms to 13 Angstroms or 10 Angstroms to 12 Angstroms. The two metal liner films described herein can extend the metal fill and capping to advance nodes, such as enabling Cu reflow in 3 nm/2 nm node, low resistivity in the middle of the line (MOL) and back end of line (BEOL), and memory. The methods described herein can also simplify the current complicated integration system to one chamber or multi chamber process involving CVD/ALD/PVD/PEALD/ion implantation.

In one or more embodiments, the barrier layer and/or metal film may be deposited via ALD. In a typical ALD process, alternating pulses or flows of "A" precursor and "B" precursor can be used to deposit a film. The alternating exposure of the surface to reactants "A" and "B" is continued until the desired thickness film is reached. However, instead of pulsing the reactants, the gases can flow simultaneously from one or more gas delivery head or nozzle and the substrate and/or gas delivery head can be moved such that the substrate is sequentially exposed to each of the reactive gases. Of course, the aforementioned ALD cycles are merely exemplary of a wide variety of ALD process cycles in which a deposited layer is formed by alternating layers of precursors and co-reactants.

In one or more embodiments, the co-reactants are in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In one or more embodiments, the barrier layer material and liner film are deposited using a multi-chamber process with separation of the barrier layer material (e.g. tantalum nitride (TaN)) and the two metal liner film. In other embodiments, a single chamber approach is used, with all processes occurring within one chamber and the different layers/films separated in processing by gas purges.

Some embodiments of the invention are directed to barrier applications, e.g. copper barrier applications. The barrier layer formed by one or more embodiments may be used as a copper barrier. Suitable barrier layers for copper barrier applications include, but are not limited to, TaN and MnN. For copper barrier applications, suitable dopants include, but are not limited to, Ru, Cu, Co, Mn, Al, Ta, Mo, Nb, V, or combinations thereof. A plasma treatment can be used after doping to promote the intermetallic compound formation between the matrix and dopant, as well as removing film impurities and improving the density of the barrier layer. In other embodiments, post treatment can include, but is not limited to, physical vapor deposition (PVD) treatment, thermal anneal, chemical enhancement, or the like. In some copper barrier applications, a high frequency plasma (defined as greater than about 14 MHz or about 40 MHz or greater) can be used with any inert gas, including, but not limited to, one or more of neon (Ne), hydrogen ($H_2$), and argon (Ar) gas. In one or more embodiments, to prevent low-k damage, a higher plasma frequency can be used (higher than 13.56 MHz). In some embodiments, the barrier layer is a copper barrier and comprises TaN doped with Ru.

Suitable precursors for depositing a liner layer include metal-containing precursors such as carbonyl-containing and cyclopentadiene-containing precursors. In a non-limiting example, if the liner layer is RuCo, the Ru-containing precursor may be triruthenium dodecacarbonyl $Ru_3(CO)_{12}$ and the Co-containing precursor may be dicobalt hexacarbonyl tertbutylacetylene (CCTBA). If the liner layer is TaRu, the Ta-containing precursor may be pentakis(dimethylamino) tantalum(PDMAT). Other suitable precursors are known to those skilled in the art. Organic species in organic-containing precursors for liner layers may get partially incorporated into the underlying layer (such as a barrier or dielectric layer), which may increase the adhesion at the liner layer-underlying layer interface.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

The two metal liner film can be formed by depositing alternating layer two metals or co-reacting two metal precursors by CVD, PVD or ALD. Depending on the liner metals used, a co-reactants or co-precursors may be used to deposit the two metal liner film. In one or more embodiments, ion implantation may be used for incorporating a second metal into a liner film comprised of a first metal. In other embodiments, physical vapor deposition (PVD) co-treatment may be used to add a second metal into the doped liner film formed over the barrier layer. In further embodiments, the two metal liner film may be annealed inside an atmosphere comprising the second metal to thermally diffuse the second metal into the two metal liner film of the first metal to form a two metal liner film over the barrier layer.

In one or more embodiments, PVD treatment with sputtering can be used as a way to incorporate the second metal into the a liner film comprising the first metal. For example, PVD treatment with cobalt (Co) can inject Co into a ruthenium film to form a liner comprising ruthenium and cobalt.

In some embodiments, instead of or in addition to using a co-reactant, a post-plasma treatment step may be used after exposing the two metal liner film comprising the first metal to the second metal precursor. According to one or more embodiments, the plasma comprises any suitable inert gas known to the skilled artisan. In one or more embodiments, the plasma comprises one or more of helium (He), argon (Ar), ammonia ($NH_3$), hydrogen ($H_2$), and nitrogen ($N_2$). In some embodiments, the plasma may comprise a mixture of Ar and $H_2$, such as a mixture having an Ar:$H_2$ molar ratio in the range from 1:1 to 1:10. The plasma power may be in the range from about 200 to about 1000 Watts. The plasma frequency may be in the range from 350 kHz to 40 MHz. The plasma treatment time may vary from 5 second to 60 seconds, such as in the range from 10 seconds to 30 seconds. In some embodiments, the pressure during plasma treatment may be in the range from 0.5 to 50 Torr, such as from 1 to 10 Torr. In some embodiments, the wafer spacing may be in the range from 100 mils to 600 mils.

In one or more embodiments, the two metal liner film comprising the first metal may be exposed to the second metal precursor during deposition, i.e. the second metal precursor may be used sequentially in the ALD cycle to provide a liner film comprised of two metals on the barrier layer.

In various embodiments, the duration of the exposure to the second metal-containing precursor may range from 1 to 60 seconds, such as in the range from 3 to 30 seconds or from 5 to 10 seconds. Longer exposures to the second metal precursor will increase the amount of second metal in the two metal liner film.

Figure 2:
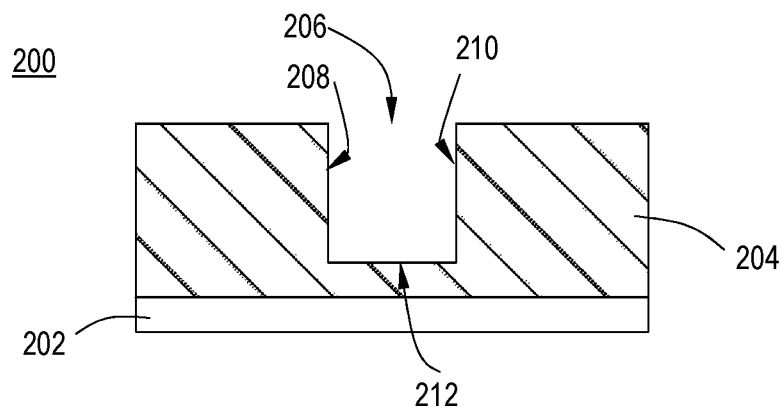
FIG. 2 illustrates a cross sectional view of an electronic device in accordance with one or more embodiments of the disclosure.

FIG. 1 depicts a process flow diagram of a method according to one or more embodiments. FIGS. 2 through 4 illustrate cross sectional views of a microelectronic device 200 in accordance with one or more embodiments of the disclosure. Referring to FIG. 2, a dielectric layer 204 is formed on a substrate 202. In one or more embodiments, the dielectric layer 204 may comprise at least one feature 206. The Figures show substrates having a single feature for illustrative purposes; however, those skilled in the art will understand that there can be more than one feature. The shape of the feature 206 can be any suitable shape including, but not limited to, trenches and cylindrical vias. In some embodiments, the feature 206 define a gap in the dielectric layer 204. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the at least one feature 206 comprises a bottom 212 and a first sidewall 208 and a second sidewall 210. In one or more embodiments, the dielectric layer 204 is a low-k dielectric layer. In certain embodiments, the dielectric layer 204 comprises silicon oxide ($SiO_x$). Further embodiments provide that the dielectric layer 204 comprises porous or carbon-doped $SiO_x$. In some embodiments, the dielectric layer 204 is a porous or carbon-doped $SiO_x$ layer with a k value less than about 5. In other embodiments, the dielectric layer 204 is a multilayer structure. For example, in one or more embodiments, the dielectric layer 204 comprises a multilayer structure having one or more of a dielectric layer, an etch stop layer, and a hard mask layer.

With reference to FIGS. 1 through 3A, at operation 104 a barrier layer 214 is deposited on a dielectric layer 204 on a substrate 202. In some embodiments, the barrier layer 214 is formed by a conformal deposition process. In some embodiments, the barrier layer 214 is formed by one or more of atomic layer deposition or chemical vapor deposition.

In one or more embodiments, the deposition of the barrier layer 214 is substantially conformal. In one or more embodiments, the barrier layer 214 forms on the first sidewall 208, the second sidewall 210, and the bottom 212 of the at least one feature. As used herein, a layer which is "substantially conformal" refers to a layer where the thickness is about the same throughout (e.g., on the top, middle and bottom of sidewalls and on the bottom of the opening 206). A layer which is substantially conformal varies in thickness by less than or equal to about 5%, 2%, 1% or 0.5%.

Figure 3A:
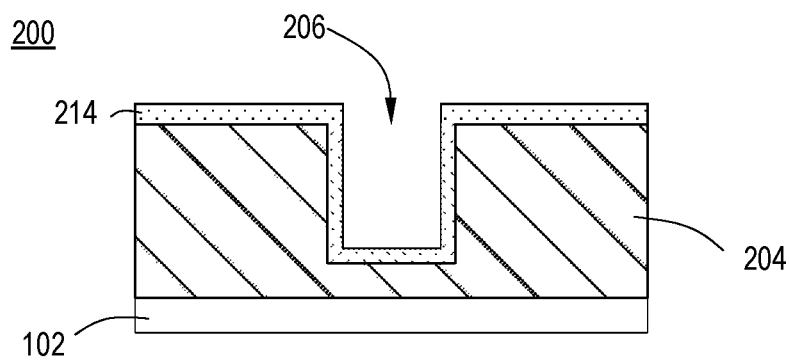
FIG. 3A illustrates a cross sectional view of an electronic device in accordance with one or more embodiments of the disclosure.
Figure 3B:
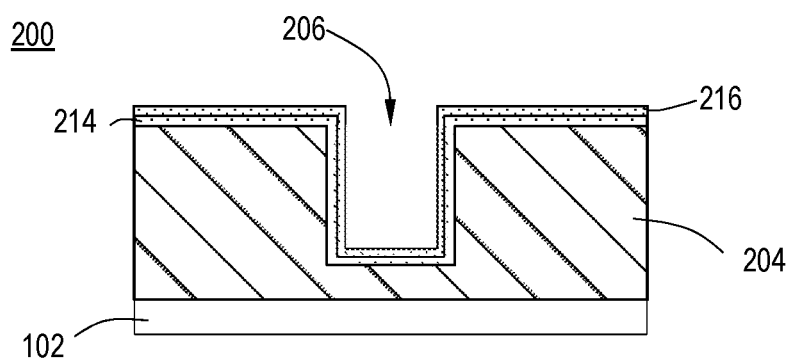
FIG. 3B illustrates a cross sectional view of an electronic device in accordance with one or more embodiments of the disclosure.
Figure 4:
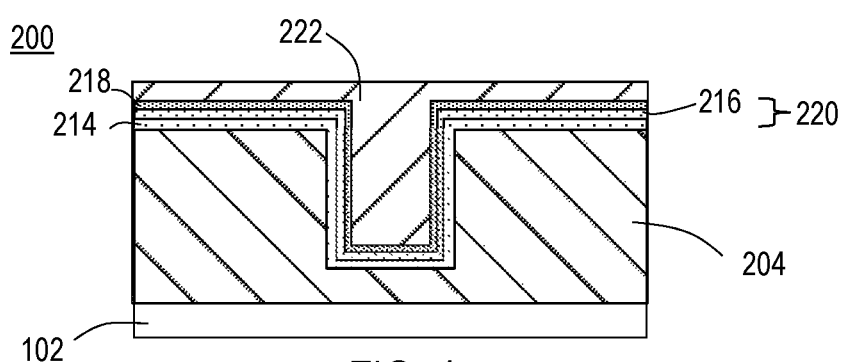
FIG. 4 illustrates a cross sectional view of an electronic device in accordance with one or more embodiments of the disclosure.

FIG. 3A shows the microelectronic device 200 after deposition of a barrier layer 214, which covers at least a portion of the first sidewall 208, the second sidewall 210 and the bottom 212 of the at least one feature 206. As illustrated in FIG. 3B, the barrier layer 214 may cover the entirety of the first sidewall 208, the second sidewall 210 and the bottom 212 of the at least one feature 206. In one or more embodiments, the barrier layer 214 can comprise one or more of tantalum (Ta), tantalum nitride (TaN), tantalum carbide (TaC), niobium (Nb), niobium nitride (NbN), manganese (Mn), manganese nitride (MnN), titanium (Ti), titanium nitride (TiN), molybdenum (Mo), molybdenum nitride (MoN), and the like.

In one or more embodiments, the barrier layer 214 is deposited by atomic layer deposition (ALD), and has a thickness in a range of from about 2 Å to about 10 Å. In some embodiments, the barrier layer 214 is deposited in a single ALD cycle. In other embodiments, the barrier layer 214 is deposited in from 1 to 15 ALD cycles.

With reference to FIG. 1 and FIG. 3B, at operation 106, a first liner film is deposited chemical vapor deposition, atomic layer deposition or PVD of a first liner film 216. In one or more embodiments, the first liner film may comprise a first metal (M1) and a second metal (M2). In one or more embodiments, the two metals comprise two metals selected from the group consisting of (M1) cobalt (Co) and (M2) manganese (Mn); (M1) Co and (M2) tantalum (Ta); (M1) Co and (M2) tungsten (W); (M1) Co and (M2) molybdenum (Mo); (M1) ruthenium (Ru) and (M2) Mn; (M1) Ru and (M2) Ta; (M1) Ru and (M2) W; (M1) Ru and (M2) Mo; (M1) Ta and (M2) Mn; and (M1) Ta and (M2) W.

In one or more embodiments, the second metal M2 is diffused into the first liner film 216 comprised of a first metal M1.

In one or more embodiments, the first liner film 216 comprises in a range of from about 0.01 to about 50 wt. % second metal, based on the total weight of the first liner film. In certain embodiments, the first liner film 216 comprises a range of from about 5% to about 70% second metal, such as a range of from about 10 to about 30 wt. % second metal, such as a range of from about 8 to about 25 wt. % second metal, or a range of from about 10 to about 20 wt. % second metal.

Figure 3C:
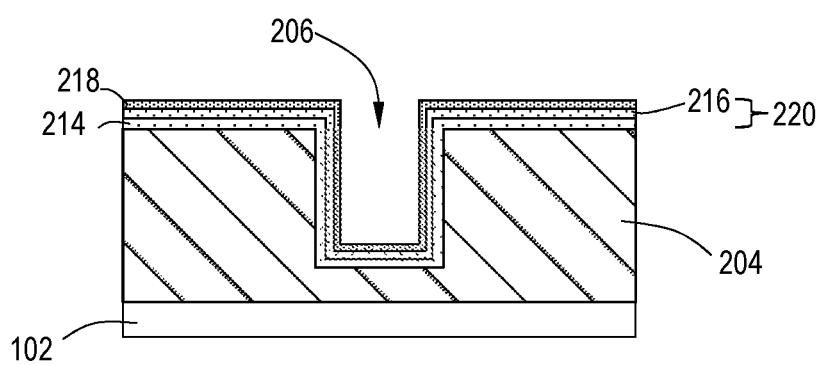
FIG. 3C illustrates a cross sectional view of an electronic device in accordance with one or more embodiments of the disclosure.

With reference to FIG. 1 and FIG. 3C, at operation 108, in some embodiments, a second liner film 218 is deposited on the first liner film 216 to provide a two metal liner film 220 comprised of a first liner film comprised of the first metal M1 and a second liner film 218 comprised of the second metal M2. In one or more embodiments, the two metals comprise two metals selected from the group consisting of (M1) cobalt (Co) and (M2) manganese (Mn); (M1) Co and (M2) tantalum (Ta); (M1) Co and (M2) tungsten (W); (M1) Co and (M2) molybdenum (Mo); (M1) ruthenium (Ru) and (M2) Mn; (M1) Ru and (M2) Ta; (M1) Ru and (M2) W; (M1) Ru and (M2) Mo; (M1) Ta and (M2) Mn; and (M1) Ta and (M2) W.

In one or more embodiments, the second liner film is deposited by atomic layer deposition (ALD), CVD or PVD. In some embodiments, the second liner film 218 is deposited in from 1 to 15 ALD cycles.

In one or more embodiments, the two metal liner film 220, which comprises the first liner film and the second liner film 218, has a combined thickness in a range of from about 5 Å to about 15 Å, or from about 8 Å to about 10 Å. In further embodiments, the combined thickness is less than about 20 Å. In some embodiments, the two metal liner film 220 has a thickness in a range of from 10 Angstroms to 20 Angstroms, from 10 Angstroms to 19 Angstroms, 10 Angstroms to 18 Angstroms, 10 Angstroms to 17 Angstroms, 10 Angstroms to 16 Angstroms, 10 Angstroms to 15 Angstroms, 10 Angstroms to 14 Angstroms, 10 Angstroms to 13 Angstroms or 10 Angstroms to 12 Angstroms.

At operation 110, the device is optionally post-processing. The optional post-processing operation 110 can be, for example, a process to modify film properties (e.g., annealing) or a further film deposition process (e.g., additional ALD or CVD processes) to grow additional films. In some embodiments, the optional post-processing operation 110 can be a process that modifies a property of the deposited film. In some embodiments, the optional post-processing operation 110 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the two metal film 220.

With reference to FIG. 4, a conductive fill metal 222 fills at least a portion of the trench 206 lined with barrier layer 214, doped barrier layer 216, and second barrier layer 218. According to one or more embodiments, the conductive fill metal 222 comprises copper (Cu) or a copper alloy. In further embodiments, the conductive fill metal 222 also comprises manganese (Mn). In other embodiments, the conductive fill metal 222 further comprises aluminum (Al). In some embodiment, the conductive fill metal 222 comprises tungsten (W).

In certain embodiments, a seeding layer (not illustrated) may be deposited on top of the two metal liner film 220. According to one or more embodiments, the seeding layer can comprise an alloy of copper, such as a Cu—Mn alloy.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. In some embodiments, the deposition of the barrier layer and the dopant film can be done in a single chamber, and then the post-processing can be performed in a separate chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 5:
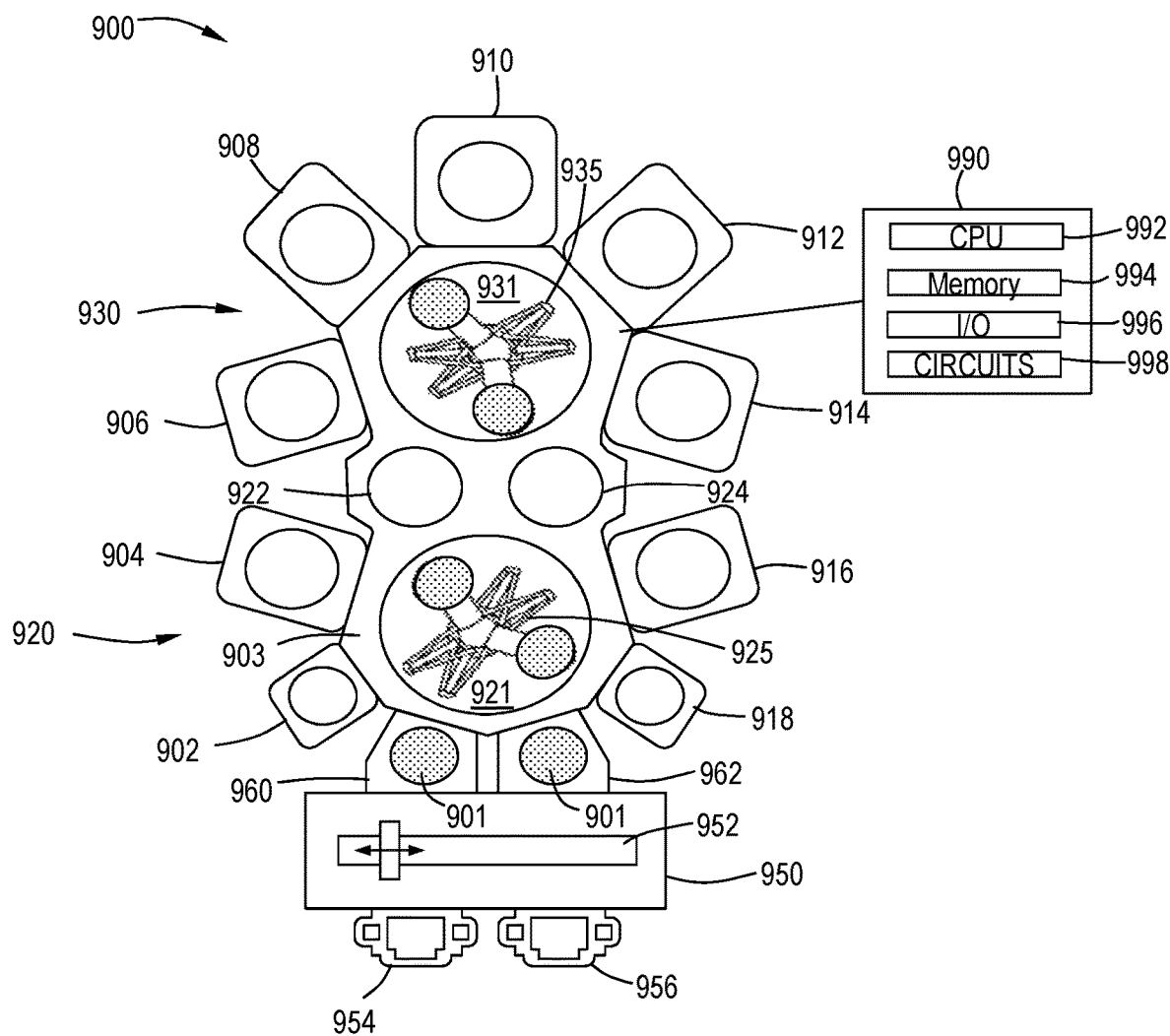
FIG. 5 illustrates a cross-sectional view of a cluster tool in accordance with one or more embodiment of the disclosure.

Additional embodiments of the disclosure are directed to processing tools 900 for the formation of the devices and practice of the methods described, as shown in FIG. 5. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, an atomic layer deposition chamber, a chemical vapor deposition chamber, an annealing chamber, and the like. The particular arrangement of process chambers and components can be varied depending on the cluster tool and should not be taken as limiting the scope of the disclosure.

In the embodiment shown in FIG. 5, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control an atomic layer deposition, chemical vapor deposition or physical vapor deposition chamber to deposit a two metal liner layer on a substrate.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma treatment chamber, a remote plasma source, an annealing chamber, and a controller connected to the central transfer station and the plurality of process stations, the controller configured to activate the robot to move the wafer between process stations, and to control a process occurring in each of the process stations.

Another aspect of the disclosure pertains to a non-transitory computer readable medium including instructions, that, when executed by a controller of a processing system, causes the processing system to perform operations of the methods described herein. In one embodiment, a non-transitory computer readable medium including instructions, that, when executed by a controller of a processing system, causes the processing system to perform operations of forming a dielectric layer on a substrate, the dielectric layer comprising at least one feature defining a gap; forming a barrier layer on the dielectric layer; forming a two metal liner film on the barrier layer; and forming a gap fill metal on the two metal liner film. The non-transitory computer readable medium may further comprise the instruction that, when executed by a controller of a processing system, causes the processing system to perform operations of depositing the two metal liner film comprising a first metal liner film and a second metal liner film.

The two metal liner films described herein provide a hybrid metal liner film that can provide tailored properties configured to improve adhesion, improved gap fill metal reflow and reduced electromigration failures. For example, a Ru liner has a wide Cu reflow window for void free gap fill by a gap fill metal, while a Co liner has good adhesion to copper for improving reliability. A combined metal liner comprised of two metals, such as Co and Ru, can leverage the beneficial properties of each metal in a single liner comprised of two metals. A two metal liner film comprised of Ru and Co, for example, shows less ISO narrow line Cu voids after annealing. Two metal liner films showed good gap filling and larger electromigration hours under testing, which is indicative of device having fewer electromigration failures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A microelectronic device comprising:
a dielectric layer on a substrate, the dielectric layer comprising at least one feature defining a gap;
a barrier layer selected from the group consisting of TaN, doped TaN, MnN and doped MnN on the dielectric layer;
a two metal liner film on the barrier layer comprising alternating layers of a first liner film comprised of a first metal M1 on the barrier layer and a second liner film comprised of a second metal M2 on the first liner film, the first liner film and the second liner film separately formed from, the first liner film having a thickness in a range of from 1 Angstroms to 10 Angstroms and the second liner film on the first liner film, the second liner film having a thickness in a range of from 1 Angstroms to 10 Angstroms wherein the first metal M1 and the second metal M2 are selected from the group consisting of M1 is ruthenium (Ru) and M2 is cobalt (Co); M1 is cobalt (Co) and M2 is manganese (Mn); M1 is Co and M2 is tantalum (Ta); M1 is Co and M2 is tungsten (W); M1 is cobalt (Co) and M2 is molybdenum (Mo); M1 is ruthenium (Ru) and M2 is manganese (Mn); M1 is ruthenium (Ru) and M2 is tungsten (W); M1 is ruthenium (Ru) and M2 is molybdenum (Mo); M1 is tantalum (Ta) and M2 is manganese (Mn); and M1 is tantalum (Ta) and M2 is tungsten (W); and
a gap fill metal on the two metal liner film, wherein the two metal liner film provides interfacial adhesion between the barrier layer and the gap fill metal.

2. The microelectronic device of claim 1, wherein the two metal liner film has a thickness in a range of from 5 Angstroms to 20 Angstroms.

3. The microelectronic device of claim 1, wherein the two metal liner film has a thickness in a range of from 5 Angstroms to 15 Angstroms.

4. The microelectronic device of claim 1, wherein the first liner film has a thickness in a range of from 1 Angstroms to 5 Angstroms.

5. The microelectronic device of claim 1, wherein the first metal M1 comprises ruthenium and second metal M2 comprises cobalt.

6. A method for forming a microelectronic device, the method comprising:
forming a dielectric layer on a substrate, the dielectric layer comprising at least one feature defining a gap;
forming a barrier layer selected from the group consisting of TaN, doped TaN, MnN and doped MnN on the dielectric layer;
forming a two metal liner film on the barrier layer comprising separately forming alternating layers of a first liner film comprised of a first metal M1 on the barrier layer and a second liner film comprised of a second metal M2 on the first liner film the first liner film having a thickness in a range of from 1 Angstroms to 10 Angstroms and comprised of a first metal M1 and a second liner film on the first liner film, the second liner film having a thickness in a range of from 1 Angstroms to 10 Angstroms and comprised of a second metal M2, wherein the first metal M1 and the second metal M2 are selected from the group consisting of M1 is ruthenium (Ru) and M2 is cobalt (Co); M1 is cobalt (Co) and M2 is manganese (Mn); M1 is Co and M2 is tantalum (Ta); M1 is Co and M2 is tungsten (W); M1 is cobalt (Co) and M2 is molybdenum (Mo); M1 is ruthenium (Ru) and M2 is manganese (Mn); M1 is ruthenium (Ru) and M2 is tungsten (W); M1 is ruthenium (Ru) and M2 is molybdenum (Mo); M1 is tantalum (Ta) and M2 is manganese (Mn); and M1 is tantalum (Ta) and M2 is tungsten (W); and
forming a gap fill metal on the two metal liner film, wherein the two metal liner film provides interfacial adhesion between the barrier layer and the gap fill metal.

7. The method of claim 6, wherein the two metal liner film has a thickness in a range of from 5 Angstroms to 20 Angstroms.

8. The method of claim 6, wherein the two metal liner film has a thickness in a range of from 5 Angstroms to 15 Angstroms.

9. The method of claim 6, wherein the first liner film has a thickness in a range of from 1 Angstroms to 5 Angstroms.

10. The method of claim 6, wherein the first metal M1 comprises ruthenium and second metal M2 comprises cobalt.

11. A microelectronic device comprising:
- a dielectric layer on a substrate, the dielectric layer comprising at least one feature defining a gap;
- a barrier layer selected from the group consisting of TaN, doped TaN, MnN and doped MnN on the dielectric layer;
- a single layer liner film having a thickness in a range of from 10 Angstroms to 20 Angstroms and comprising an alloy of two metals on the barrier layer, the two metals consisting of a first metal M1 and a second metal M2 selected from the group consisting of M1 is ruthenium (Ru) and M2 is cobalt (Co); M1 is ruthenium (Ru) and M2 is tungsten (W); and M1 is ruthenium (Ru) and M2 is molybdenum (Mo); and
- a gap fill metal on the single layer liner film, wherein the single layer liner film provides interfacial adhesion between the barrier layer and the gap fill metal.

12. The microelectronic device of claim 11, wherein the single layer liner film has a thickness in a range of from 10 Angstroms to 19 Angstroms.

13. The microelectronic device of claim 11, wherein the single layer liner film has a thickness in a range of from 10 Angstroms to 15 Angstroms.

14. A method for forming a microelectronic device, the method comprising:
- forming a dielectric layer on a substrate, the dielectric layer comprising at least one feature defining a gap;
- forming a barrier layer selected from the group consisting of TaN, doped TaN, MnN and doped MnN on the dielectric layer;
- forming a single layer liner film having a thickness in a range of from 10 Angstroms to 20 Angstroms and comprising an alloy of two metals on the barrier layer, the two metals consisting of a first metal M1 and a second metal M2 selected from the group consisting of M1 is ruthenium (Ru) and M2 is cobalt (Co); M1 is ruthenium (Ru) and M2 is tungsten (W); and M1 is ruthenium (Ru) and M2 is molybdenum (Mo); and
- forming a gap fill metal on the single layer liner film, wherein the single layer liner film provides interfacial adhesion between the barrier layer and the gap fill metal.

15. The method of claim 14, wherein the single layer liner film has a thickness in a range of from 10 Angstroms to 19 Angstroms.

16. The method of claim 14, wherein the single layer liner film has a thickness in a range of from 10 Angstroms to 15 Angstroms.

* * * * *